(12) United States Patent
Zou

(10) Patent No.: US 10,433,042 B2
(45) Date of Patent: Oct. 1, 2019

(54) MEMS MULTI-MODULE ASSEMBLY, MANUFACTURING METHOD AND ELECTRONICS APPARATUS

(71) Applicant: Goertek Inc., Shandong (CN)

(72) Inventor: Quanbo Zou, Shandong (CN)

(73) Assignee: Goertek Inc., Shandong (CN)

( * ) Notice: Subject to any disclaimer, the term of this patent is extended or adjusted under 35 U.S.C. 154(b) by 0 days.

(21) Appl. No.: 15/772,576

(22) PCT Filed: Nov. 3, 2015

(86) PCT No.: PCT/CN2015/093730
§ 371 (c)(1),
(2) Date: May 1, 2018

(87) PCT Pub. No.: WO2017/075764
PCT Pub. Date: May 11, 2017

(65) Prior Publication Data
US 2018/0324510 A1    Nov. 8, 2018

(51) Int. Cl.
*H04R 1/04* (2006.01)
*H01L 25/00* (2006.01)
(Continued)

(52) U.S. Cl.
CPC .............. *H04R 1/04* (2013.01); *B81B 7/0061* (2013.01); *B81B 7/02* (2013.01); *G01L 9/0001* (2013.01); *G01L 19/0092* (2013.01); *H01L 25/00* (2013.01); *H04R 19/005* (2013.01); *H04R 19/04* (2013.01); *B81B 2201/0257* (2013.01); *B81B 2201/0264* (2013.01);
(Continued)

(58) Field of Classification Search
CPC ........ H04R 1/04; H04R 19/005; H04R 19/04; H04R 2201/0264; H04R 2201/003; H04R 2499/11; G10L 9/001; G10L 19/0092; B81B 2201/0257; B81B 2201/0264; B81B 7/0061; B81B 7/02; B81B 2207/102; H01L 25/00; G01L 9/0001; G01L 19/0092
See application file for complete search history.

(56) References Cited

U.S. PATENT DOCUMENTS 6,781,231 B2    8/2004  Minervini
8,368,153 B2    2/2013  Huang et al.
(Continued)

FOREIGN PATENT DOCUMENTS

CN    101308803 A    11/2008
CN    102685657 A    9/2012
(Continued)

OTHER PUBLICATIONS

International Searching Authority, International Search Report and Written Opinion for International Application No. PCT/CN2015/093730, dated Jul. 25, 2016, 7 pages, State Intellectual Property Office of the P.R.C., China.

*Primary Examiner* — Andrew L Sniezek
(74) *Attorney, Agent, or Firm* — Alston & Bird LLP

(57) ABSTRACT

A MEMS multi-module assembly, manufacturing method, and electronics apparatus are disclosed herein. The MEMS multi-module assembly comprises: a first die having a first hole; and a second die stacked on the first die, having a second MEMS device, wherein the second MEMS device is connected outside via the first hole.

14 Claims, 3 Drawing Sheets

(51) Int. Cl.
  *H04R 19/04* (2006.01)
  *G01L 9/00* (2006.01)
  *G01L 19/00* (2006.01)
  *H04R 19/00* (2006.01)
  *B81B 7/00* (2006.01)
  *B81B 7/02* (2006.01)

(52) U.S. Cl.
  CPC .. *B81B 2207/012* (2013.01); *H04R 2201/003* (2013.01); *H04R 2499/11* (2013.01)

(56) References Cited

U.S. PATENT DOCUMENTS

| | | | |
|---|---|---|---|
| 9,018,029 B1* | 4/2015 | Bowles | B81B 7/02 257/417 |
| 2004/0163717 A1* | 8/2004 | Gilleo | B81B 7/0061 137/565.29 |
| 2008/0157238 A1 | 7/2008 | Hsiao | |
| 2008/0284035 A1 | 11/2008 | Brunnbauer et al. | |
| 2009/0129622 A1 | 5/2009 | Chen et al. | |
| 2010/0284553 A1* | 11/2010 | Conti | B81B 7/0061 381/174 |
| 2012/0235256 A1 | 9/2012 | Zoellin et al. | |
| 2015/0158722 A1 | 6/2015 | Lim et al. | |
| 2017/0044005 A1* | 2/2017 | Bowles | B81B 7/02 |

FOREIGN PATENT DOCUMENTS

CN         103454052 A    12/2013
WO   WO 2007/112743 A1   10/2007

\* cited by examiner

MEMS MULTI-MODULE ASSEMBLY, MANUFACTURING METHOD AND ELECTRONICS APPARATUS

CROSS-REFERENCE TO RELATED APPLICATIONS

This application is a National Stage of International Application No. PCT/CN2015/093730, filed on Nov. 3, 2015, which is hereby incorporated by reference in its entirety.

BACKGROUND

Technical Field

The present invention relates to the technical field of MEMS, and in particular, to a MEMS multi-module assembly, a method for manufacturing a MEMS multi-module assembly and an electronics apparatus.

Description of Related Art

Currently, more and more apparatuses use MEMS devices, and one apparatus may use multiple MEMS devices. In the prior art, the multiple MEMS devices are provided in different dies, and these dies are encapsulated into different chips. Generally, the die refers to a chip without encapsulation and formed after singulation and test of a wafer. The die has pads for encapsulation.

For example, the US patent application No. US2015/0158722 discloses a system and apparatus having MEMS acoustic sensors and other MEMS sensors and methods of fabrication of the same, which is hereby incorporated as a whole herein as reference.

U.S. Pat. No. 6,781,231 discloses a micro-electromechanical system package with environmental and interference shield, which is hereby incorporated as a whole herein as reference.

U.S. Pat. No. 8,368,153 discloses a wafer level package of MEMS microphone and manufacturing method thereof, which is hereby incorporated as a whole herein as reference.

The PCT application No. WO/2007/112743A1 discloses a single die MEMS acoustic transducer and manufacturing method, which is hereby incorporated as a whole herein as reference.

The inventors of this invention have conceived that the apparatus containing multiple MEMS chips shall be improved to further reduce the package size.

BRIEF SUMMARY

One object of this invention is to provide a new technical solution for a MEMS multi-module assembly.

According to a first aspect of the present invention, there is provided a MEMS multi-module assembly, comprising: a first die having a first hole; and a second die stacked on the first die, having a second MEMS device, wherein the second MEMS device is connected outside via the first hole.

Preferably, the first die has a pad on the side opposite to the second die.

Preferably, the first die has a first MEMS device. Preferably, the first MEMS device is connected outside via the first hole.

Preferably, the MEMS multi-module assembly further comprises: a third die stacked on the second die.

Preferably, the third die has a pad on the side opposite to the second die.

Preferably, the second die has a second hole, the third die has a third MEMS device, and the third MEMS device is connected outside via the first hole and the second hole.

Preferably, the first die and the second die are bonded through at least one of metal-metal thermal-compression bond, metal/alloy eutectic bond, or electric-conductive adhesive bond.

Preferably, the second die and the third die are bonded through at least one of metal-metal thermal-compression bond, metal/alloy eutectic bond, or electric-conductive adhesive bond.

Preferably, the first die and the second die are vertically electrically interconnected by through silicon via.

Preferably, the second die and the third die are vertically electrically interconnected by through silicon via.

According to a second aspect of the present invention, there is provided a method for manufacturing a MEMS multi-module assembly, comprising: forming a first wafer, wherein the first wafer has at least one first MEMS device and has at least one first hole; forming a second wafer, wherein the second wafer has at least one second MEMS device; stacking the second wafer onto the first wafer, wherein the second MEMS device is connected outside via the first hole; and singulating the wafers at a wafer level, to form a MEMS multi-module assembly, wherein each wafer is singulated into at least one dies.

Preferably, the method further comprises: forming a pad on the first wafer at the side opposite to the second wafer.

Preferably, the first MEMS device is connected outside via the first hole.

Preferably, the method further comprises: stacking a third wafer on the second wafer.

Preferably, the method further comprises: forming a pad on the third wafer at the side opposite to the second wafer.

Preferably, the second wafer has at least one second hole, the third wafer has at least one third MEMS device, and the third MEMS device is connected outside via the first hole and the second hole.

Preferably, the method further comprises: bonding the first wafer and the second wafer through at least one of metal-metal thermal-compression bond, metal/alloy eutectic bond, or electric-conductive adhesive bond.

Preferably, the method further comprises: bonding the second wafer and the third wafer through at least one of metal-metal thermal-compression bond, metal/alloy eutectic bond, or electric-conductive adhesive bond.

Preferably, the method further comprises: vertically electrically interconnecting the first wafer and the second wafer by through silicon via.

Preferably, the method further comprises: vertically electrically interconnecting the second wafer and the third wafer by through silicon via.

According to a third aspect of the present invention, there is provided an electronics apparatus, comprising the MEMS multi-module assembly according to the present invention.

The inventors of the present invention have found that, in the prior art, the dies containing MEMS devices are separately encapsulated or are encapsulated in parallel. The package size of the MEMS dies of the prior art is relatively big. The inventors of this invention have found that the dies containing MEMS devices can be stacked, which is beneficial. So, the task to be implemented by or the technical problem to be solved by the present invention has not been conceived or anticipated by a person skilled in the art and thus the present invention is a new solution.

Further features of the present invention and advantages thereof will become apparent from the following detailed description of exemplary embodiments according to the present invention with reference to the attached drawings.

BRIEF DESCRIPTION OF THE FIGURES

The accompanying drawings, which are incorporated in and constitute a part of the specification, illustrate embodiments of the invention and, together with the description thereof, serve to explain the principles of the invention.

DETAILED DESCRIPTION OF VARIOUS EMBODIMENTS

Figure 1:
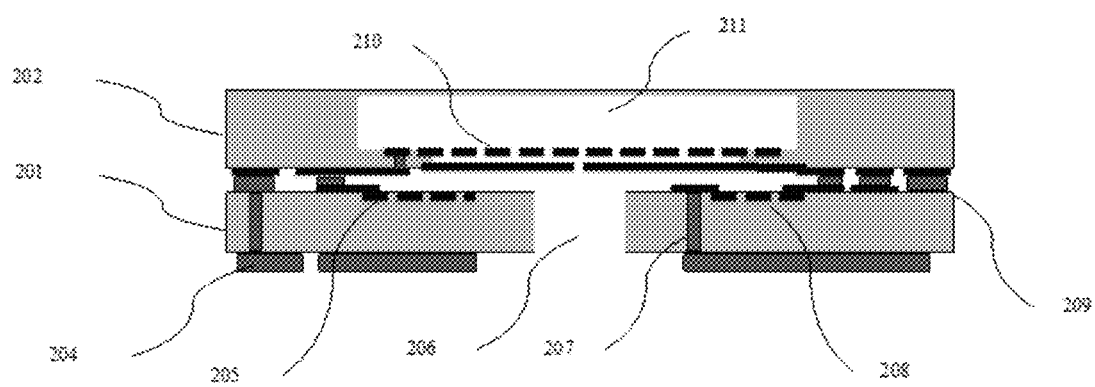
FIG. 1 is a schematic diagram of a MEMS multi-module assembly according to a first embodiment of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

First Embodiment

FIG. 1 shows a schematic diagram of a MEMS multi-module assembly according to a first embodiment of the present invention.

As shown in FIG. 1, the MEMS multi-module assembly contains a first die 201 and a second die 202.

The first die 201 has a first hole 206. The first die 201 has a finished first MEMS device 208. Besides, the first die 201 can further have a first ASIC 205.

The second die 202 is stacked on the first die 201. The second die 202 has a second MEMS device 210.

In the present invention, at least two dies are arranged in a manner of stack, at least one of which has a MEMS device. This arrangement can reduced the package size.

For example, the second MEMS device 210 is connected outside via the first hole 206. The second MEMS device 210 is, for example, a device that shall be connected outside during operation, such as MEMS microphone. The second MEMS device 210 includes a back chamber 211. In such a situation, the arrangement according to the present invention is advantageous. According to the arrangement of this invention, the package size can be reduced and the connection between the MEMS device and the outside can be maintained.

For example, the first MEMS device 208 can also be connected outside via the first hole 206. The first MEMS device 208 is, for example, a device that shall be connected outside during operation, such as MEMS microphone, MEMS pressure sensor and so on. In such a situation, the arrangement according to the present invention is advantageous. According to the arrangement of this invention, the package size can be reduced and at least two MEMS devices share the same hole to connect outside.

For example, the first die 201 and the second die 202 are bonded through bonding layer 209 such as metal-metal (Au—Au, Al—Al, Cu—Cu and so on) thermal-compression bond, metal/alloy eutectic bond, and/or electric-conductive adhesive bond.

The first die 201 can include pads 204. The pads 204 can be located on the first die at the side opposite to the second die. The first die 201 and the second die 202 are vertically electrically interconnected by a through silicon via 207. The through silicon via 207 is connected to the pad 204.

The MEMS multi-module assembly can be used in an electronics apparatus directly or can be used after a further encapsulation.

Second Embodiment

Figure 2:
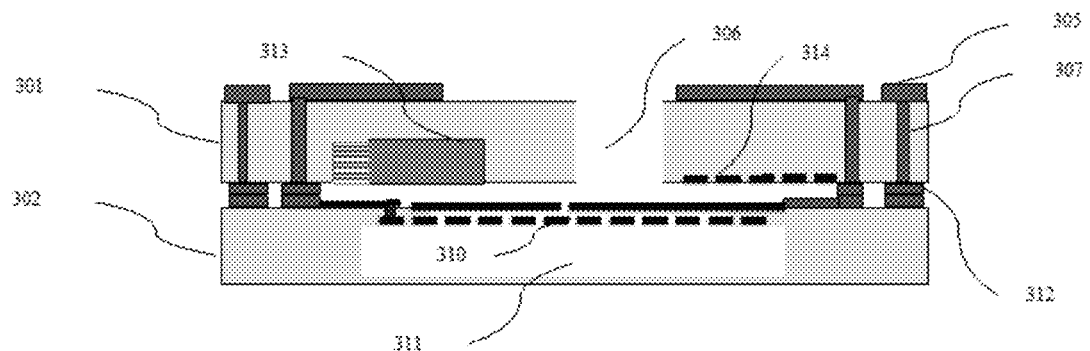
FIG. 2 is a schematic diagram of a MEMS multi-module assembly according to a second embodiment of the present invention.

FIG. 2 shows a schematic diagram of a MEMS multi-module assembly according to a second embodiment of the present invention. The MEMS multi-module assembly as shown in FIG. 2 is a variant of the assembly as shown in FIG. 1.

As shown in FIG. 2, the MEMS multi-module assembly contains a first die 301 and a second die 302.

The first die 301 has a first hole 306. The first die 301 has a finished first MEMS device 313. Besides, the first die 301 can further have a first ASIC 314.

The first die 301 and the second die 302 are stacked. The second die 302 has a second MEMS device 310.

For example, the second MEMS device 310 is connected outside via the first hole 306. The second MEMS device 310 is, for example, a device that shall be connected outside during operation, such as MEMS microphone. The second MEMS device 310 includes a back chamber 311. In such a situation, the arrangement according to the present invention is advantageous. According to the arrangement of this invention, the package size can be reduced and the connection between the MEMS device and the outside can be maintained.

For example, the first MEMS device 313 can also be connected outside via the first hole 306. The first MEMS device 313 is, for example, a device that shall be connected outside during operation, such as MEMS microphone, MEMS pressure sensor and so on. In such a situation, the arrangement according to the present invention is advantageous. According to the arrangement of this invention, the package size can be reduced and at least two MEMS devices share the same hole to connect outside.

For example, the first die 301 and the second die 302 are bonded through bonding layer 309 such as metal-metal thermal-compression bond, metal/alloy eutectic bond, and/or electric-conductive adhesive bond.

The first die 301 can include pads 304. The pads 304 can be located on the first die at the side opposite to the second die. The first die 301 and the second die 302 are vertically electrically interconnected by a through silicon via 307. The through silicon via 307 is connected to the pad 204.

The MEMS multi-module assembly can be used in an electronics apparatus directly or can be used after a further encapsulation.

Figure 3:
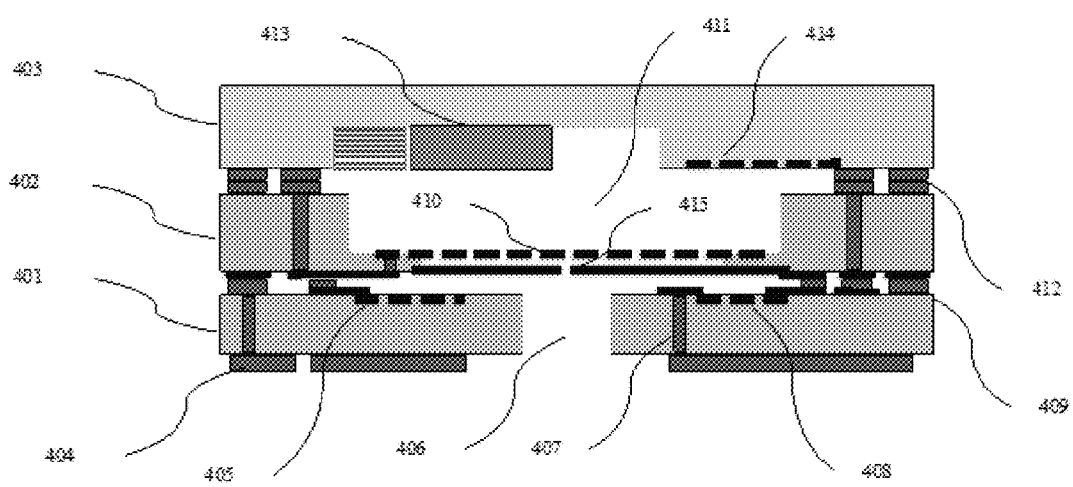
FIG. 3 is a schematic diagram of a MEMS multi-module assembly according to a third embodiment of the present invention.
Figure 4:
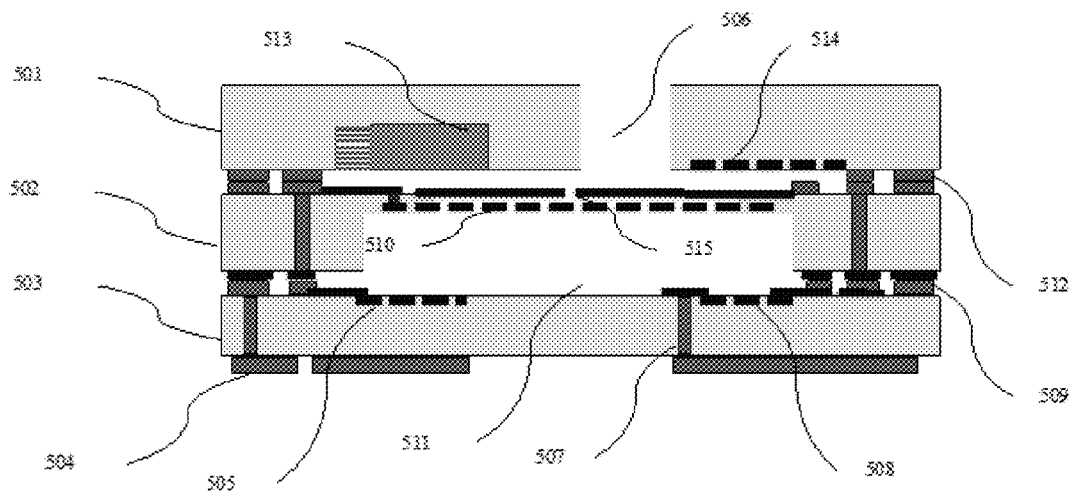
FIG. 4 is a schematic diagram of a MEMS multi-module assembly according to a fourth embodiment of the present invention.

FIG. 3 and FIG. 4 show embodiments containing three layers of dies. It shall be understood by a person skilled in the art that the assembly according to the present invention can contain more layers of dies.

Third Embodiment

FIG. 3 shows a schematic diagram of a MEMS multi-module assembly according to a first embodiment of the present invention. FIG. 3 shows a first die 401, a second die 402 and a third die 403. As shown in FIG. 3, the first die 401 has a first hole 406. The first die 401 has a finished first MEMS device 408. Besides, the first die 401 can further have a first ASIC 405.

The second die 402 is stacked on the first die 401. The second die 402 has a second MEMS device 410.

For example, the second MEMS device 410 is connected outside via the first hole 406. The second MEMS device 410 is, for example, a device that shall be connected outside during operation, such as MEMS microphone. The second MEMS device 410 includes a back chamber 411. In such a situation, the arrangement according to the present invention is advantageous. According to the arrangement of this invention, the package size can be reduced and the connection between the MEMS device and the outside can be maintained.

For example, the first MEMS device 408 can also be connected outside via the first hole 406. The first MEMS device 408 is, for example, a device that shall be connected outside during operation, such as MEMS microphone, MEMS pressure sensor and so on. In such a situation, the arrangement according to the present invention is advantageous.

The third die 403 is stacked on the second die 402. The third die 403 contains a third MEMS device 413 and a third ASIC 414. For example, the third MEMS device 413 is, for example, a device that shall be connected outside during operation, such as MEMS microphone, MEMS pressure sensor and so on. As shown in FIG. 3, the second MEMS device 410 has a second hole 415. The third MEMS device 413 can be connected outside via the first hole 406 and the second hole 415. Thus, the present invention can be used for the stack having multiple layers of dies which shall be connected outside, thereby reducing the package size. Furthermore, according to the arrangement of this invention, at least two (or three) MEMS device can shall a hole to be connected outside.

For example, the first die 401 and the second die 402 are bonded through bonding layer 409 such as metal-metal (Au—Au, Al—Al, Cu—Cu and so on) thermal-compression bond, metal/alloy eutectic bond, and/or electric-conductive adhesive bond. Similarly, for example, the second die 402 and the third die 403 are bonded through bonding layer 412 such as metal-metal (Au—Au, Al—Al, Cu—Cu and so on) thermal-compression bond, metal/alloy eutectic bond, and/or electric-conductive adhesive bond.

The first die 401 can include pads 404. The pads 404 can be located on the first die at the side opposite to the second die. The first die 401 and the second die 402 are vertically electrically interconnected by a through silicon via 407. The through silicon via 407 is connected to the pad 404. Similarly, as shown in FIG. 3, the second die 402 and the third die 403 are vertically electrically interconnected by a through silicon via 407.

The MEMS multi-module assembly can be used in an electronics apparatus directly or can be used after a further encapsulation.

Fourth Embodiment

FIG. 4 shows a schematic diagram of a MEMS multi-module assembly according to a first embodiment of the present invention.

Figure 5:
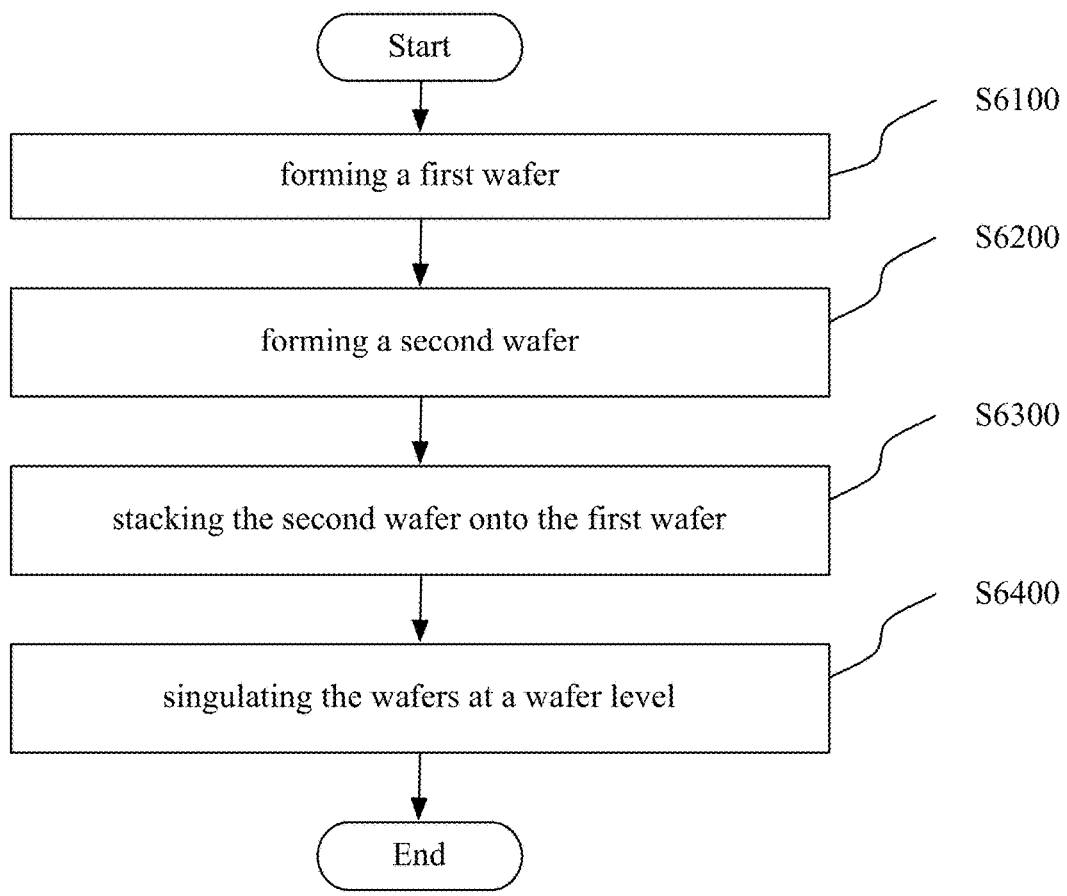
FIG. 5 is a flow chart of a method for manufacturing a MEMS multi-module assembly according to a fifth embodiment of the present invention.

FIG. 4 shows a first die 501, a second die 502 and a third die 503. As shown in FIG. 5, the first die 501 has a first hole 506. The first die 501 has a finished first MEMS device 513. Besides, the first die 501 can further have a first ASIC 514.

The second die 502 and the first die 501 are stacked. The second die 502 has a second MEMS device 510.

For example, the second MEMS device 510 is connected outside via the first hole 506. The second MEMS device 510 is, for example, a device that shall be connected outside during operation, such as MEMS microphone. The second MEMS device 510 includes a back chamber 511. In such a situation, the arrangement according to the present invention is advantageous. According to the arrangement of this invention, the package size can be reduced and the connection between the MEMS device and the outside can be maintained.

For example, the first MEMS device 513 can also be connected outside via the first hole 506. The first MEMS device 513 is, for example, a device that shall be connected outside during operation, such as MEMS microphone, MEMS pressure sensor and so on. In such a situation, the arrangement according to the present invention is advantageous.

The third die 503 and the second die 502 are stacked (at the side opposite to the first die). The third die 503 contains a third MEMS device 508 and a third ASIC 505. For example, the third MEMS device 508 is, for example, a device that shall be connected outside during operation, such as MEMS microphone, MEMS pressure sensor and so on. As shown in FIG. 4, the second MEMS device 510 has a second hole 515. The third MEMS device 508 can be connected outside via the first hole 506 and the second hole 515. Thus, the present invention can be used for the stack having multiple layers of dies which shall be connected outside, thereby reducing the package size. Furthermore, according to the arrangement of this invention, at least two (or three) MEMS device can shall a hole to be connected outside.

For example, the first die 501 and the second die 502 are bonded through bonding layer 512 such as metal-metal (Au—Au, Al—Al, Cu—Cu and so on) thermal-compression bond, metal/alloy eutectic bond, and/or electric-conductive adhesive bond. Similarly, for example, the second die 502 and the third die 503 are bonded through bonding layer 509 such as metal-metal (Au—Au, Al—Al, Cu—Cu and so on) thermal-compression bond, metal/alloy eutectic bond, and/or electric-conductive adhesive bond.

The third die 501 can include pads 504. The pads 504 can be located on the third die at the side opposite to the second die. The first die 501 and the second die 502 are vertically electrically interconnected by a through silicon via 507. The second die 502 and the third die 503 are vertically electrically interconnected by a through silicon via 507. The through silicon via 507 is connected to the pad 504.

It shall be understood by a person skilled in the art that the above MEMS multi-module assembly can be used in an electronics apparatus directly or can be used after a further encapsulation.

Fifth Embodiment

FIG. 5 shows a flow chart of a method for manufacturing a MEMS multi-module assembly according to a fifth embodiment of the present invention.

As shown in FIG. 5, at step S6100, a first wafer is formed, wherein the first wafer has at least one first MEMS device and has at least one first hole.

For example, the first MEMS device can be a device that shall be connected outside during operation, such as MEMS microphone, MEMS pressure sensor and so on. Alternatively, the first MEMS device is connected outside via the first hole.

At step S6200, a second wafer is formed, wherein the second wafer has at least one second MEMS device.

At step S6300, the second wafer is stacked onto the first wafer, wherein the second MEMS device is connected outside via the first hole.

For example, a third wafer can be stacked onto the second wafer. The first, second and third wafers are all finished wafer.

In an example, a pad is formed on the first wafer at the side opposite to the second wafer, for subsequent installation. In another example, a pad is formed on the third wafer at the side opposite to the second wafer, for subsequent installation.

For example, the second wafer has at least one second hole, and the second hole can be located in the second MEMS device. The third wafer has at least one third MEMS device. The third MEMS device is connected outside via the first hole and the second hole.

The first wafer and the second wafer can be bonded through at least one of metal-metal thermal-compression bond, metal/alloy eutectic bond, or electric-conductive adhesive bond. The second wafer and the third wafer can be bonded through at least one of metal-metal thermal-compression bond, metal/alloy eutectic bond, or electric-conductive adhesive bond.

The first wafer and the second wafer can be vertically electrically interconnected by a through silicon via. The second wafer and the third wafer can be vertically electrically interconnected by a through silicon via.

At step S6400, the wafers are singulated at a wafer level, to form a MEMS multi-module assembly, wherein each wafer is singulated into at least one dies.

Sixth Embodiment

In the sixth embodiment, there is provided an electronics apparatus. The electronics apparatus comprises the MEMS multi-module assembly according to the present invention. The electronics apparatus can, for example, be a mobile phone, a pad, a smart watch, a smart glasses and so on. The electronics apparatus can include multiple MEMS devices, such as MEMS microphone, pressure sensor and so on. The present invention can reduce the package size of these devices, and thus the usage of this invention in these electronics apparatus is advantageous.

It should be noted that the two expressions of "a die/wafer is stacked on another die/wafer" and "a die/wafer and another die/wafer are stacked" can be used in the same sense in the present invention.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A MEMS (Micro Electromechanical System) multi-module assembly, comprising:
    a first die having a first MEMS device and a first hole;
    a second die stacked on the first die with a first space formed therebetween, the second die having a second MEMS device with a second hole, and
    a third die stacked on the second die having a third MEMS device, a second space being formed between the second die and the third die,
    wherein the first MEMS device is in communication with an area outside the assembly via the first hole and the first space, the second MEMS device is in communication with the area outside the assembly via the first hole, the first space, and the second hole, and the third MEMS device is in communication with the area outside the assembly via the first hole, the first space, the second hole, and the second space.

2. The MEMS multi-module assembly according to claim 1, wherein the first die has a pad on the side opposite to the second die.

3. The MEMS multi-module assembly according to claim 1, wherein the third die has a pad on the side opposite to the second die.

4. The MEMS multi-module assembly according to claim 1, wherein the first die and the second die are bonded through at least one of metal-metal thermal-compression bond, metal/alloy eutectic bond, or electric-conductive adhesive bond.

5. The MEMS multi-module assembly according to claim 1, wherein the second die and the third die are bonded through at least one of metal-metal thermal-compression bond, metal/alloy eutectic bond, or electric-conductive adhesive bond.

6. The MEMS multi-module assembly according to claim 1, wherein the first die and the second die are vertically electrically interconnected by through silicon via.

7. The MEMS multi-module assembly according to claim 1, wherein the second die and the third die are vertically electrically interconnected by through silicon via.

8. A method for manufacturing a MEMS (Micro Electromechanical System) multi-module assembly, comprising:
    forming a first wafer, wherein the first wafer has at least one first MEMS device and has at least one first hole;
    forming a second wafer, wherein the second wafer has at least one second MEMS device with at least one second hole;
    stacking the second wafer onto the first wafer with a first space formed therebetween; and
    forming a third wafer, wherein the third wafer has at least one third MEMS device;

stacking the third wafer onto the second wafer with a second space formed therebetween; and singulating the wafers at a wafer level, to form a MEMS multi-module assembly, wherein each wafer is singulated into at least one die, wherein the first MEMS device is in communication with an area outside the assembly via the first hole and the first space, the second MEMS device is in communication with the area outside the assembly via the first hole, the first space, and the second hole, and the third MEMS device is in communication with the area outside the assembly via the first hole, the first space, the second hole, and the second space.

9. The method according to claim 8, further comprising: forming a pad on the first wafer at the side opposite to the second wafer.

10. The method according to claim 8, further comprising: forming a pad on the third wafer at the side opposite to the second wafer.

11. The method according to claim 8, further comprising: bonding the first wafer and the second wafer through at least one of metal-metal thermal-compression bond, metal/alloy eutectic bond, or electric-conductive adhesive bond.

12. The method according to claim 8, further comprising: bonding the second wafer and the third wafer through at least one of metal-metal thermal-compression bond, metal/alloy eutectic bond, or electric-conductive adhesive bond.

13. The method according to claim 8, further comprising: vertically electrically interconnecting the first wafer and the second wafer by through silicon via.

14. The method according to claim 8, further comprising: vertically electrically interconnecting the second wafer and the third wafer by through silicon via.

* * * * *